(12) United States Patent
Ahr et al.

(10) Patent No.: US 8,994,161 B2
(45) Date of Patent: Mar. 31, 2015

(54) SEMICONDUCTOR DEVICE PACKAGE AND METHODS FOR PRODUCING SAME

(75) Inventors: Michael Ahr, Laaber (DE); Bakuri Lanchava, Regensburg (DE)

(73) Assignee: Infineon Technologies AG (DE)

( * ) Notice: Subject to any disclaimer, the term of this patent is extended or adjusted under 35 U.S.C. 154(b) by 843 days.

(21) Appl. No.: 11/619,106

(22) Filed: Jan. 2, 2007

(65) Prior Publication Data

US 2007/0181997 A1    Aug. 9, 2007

(30) Foreign Application Priority Data

Jan. 3, 2006    (DE) .................. 10 2006 000 724

(51) Int. Cl.
| H01L 23/02 | (2006.01) |
| H01L 23/495 | (2006.01) |
| H01L 21/56 | (2006.01) |
| H01L 23/31 | (2006.01) |
| H01L 23/433 | (2006.01) |
| H01L 23/00 | (2006.01) |
| H01L 25/10 | (2006.01) |

(52) U.S. Cl.
CPC .......... *H01L 21/561* (2013.01); *H01L 23/3128* (2013.01); *H01L 23/4334* (2013.01); *H01L 24/97* (2013.01); *H01L 25/105* (2013.01); H01L 2224/48091 (2013.01); H01L 2224/48227 (2013.01); H01L 2224/48465 (2013.01); H01L 2224/97 (2013.01); H01L 2924/01013 (2013.01); H01L 2924/01029 (2013.01); H01L 2924/01082 (2013.01); H01L 2924/10329 (2013.01); H01L 2924/15311 (2013.01); H01L 24/48 (2013.01); H01L 2924/01005 (2013.01); H01L 2924/01006 (2013.01); H01L 2924/01033 (2013.01); H01L 2225/1023 (2013.01); H01L 2225/1094 (2013.01); H01L 2224/48247 (2013.01); H01L 2924/1815 (2013.01)
USPC .......... 257/686; 257/666; 257/675; 257/676; 257/692; 257/709; 257/773; 257/777; 257/787; 257/E23.01; 257/E23.031; 257/E23.051; 257/E23.08; 257/E21.502; 257/E21.506

(58) Field of Classification Search
CPC ............ H01L 23/49861; H01L 21/768; H01L 21/76892; H01L 21/4846; H01L 2225/06548
USPC .................. 257/666, 675, 720, 796, 686, 706
See application file for complete search history.

(56) References Cited

U.S. PATENT DOCUMENTS

| 5,311,060 | A | * | 5/1994 | Rostoker et al. | ............... 257/796 |
| 5,705,851 | A | * | 1/1998 | Mostafazadeh et al. | ...... 257/675 |
| 5,933,709 | A | * | 8/1999 | Chun | ............................. 438/122 |
| 6,118,174 | A | | 9/2000 | Kim | |
| 6,291,271 | B1 | * | 9/2001 | Lee et al. | ...................... 438/121 |
| 6,369,455 | B1 | * | 4/2002 | Ho et al. | ....................... 257/796 |
| 6,472,741 | B1 | * | 10/2002 | Chen et al. | .................... 257/712 |

(Continued)

*Primary Examiner* — Jesse Y Miyoshi
(74) *Attorney, Agent, or Firm* — Schwegman Lundberg & Woessner, P.A.

(57) ABSTRACT

Some embodiments have a semiconductor chip supported above a substrate, a filler layer encapsulating the semiconductor chip, a heat sink; and through contacts extending upwardly from the substrate nearly to an upper surface of the filler layer. In some embodiments of electronic packages, the through contacts separated from the heat sink by a trench cut into the upper surface of the filler layer, the through contacts intersecting one wall of the trench and the heat sink intersecting the other wall of the trench an electronic semiconductor package. A method of forming the package and a lead frame are also disclosed.

10 Claims, 7 Drawing Sheets

(56) References Cited

U.S. PATENT DOCUMENTS

| | | |
|---|---|---|
| 6,818,981 B2 | 11/2004 | Kwon, II et al. |
| 7,196,415 B2 * | 3/2007 | Zhong et al. .................. 257/712 |
| 7,361,533 B1 * | 4/2008 | Huemoeller et al. ......... 438/123 |
| 2002/0105079 A1 * | 8/2002 | Yamaguchi .................... 257/748 |
| 2003/0197290 A1 * | 10/2003 | Crowley et al. ............... 257/787 |
| 2004/0043539 A1 | 3/2004 | Taekeun et al. |
| 2005/0104194 A1 * | 5/2005 | Weng et al. .................... 257/706 |
| 2005/0139969 A1 * | 6/2005 | Lee et al. ....................... 257/672 |

\* cited by examiner

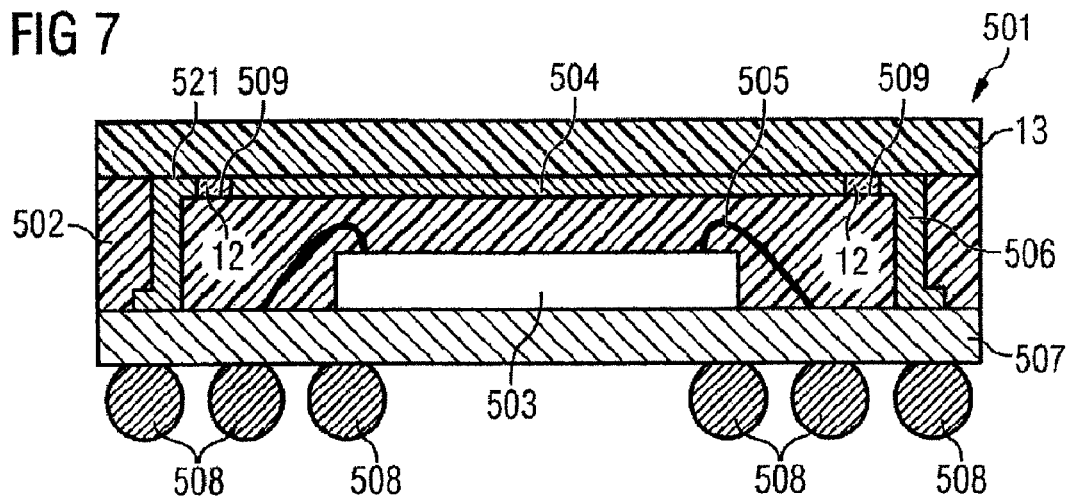
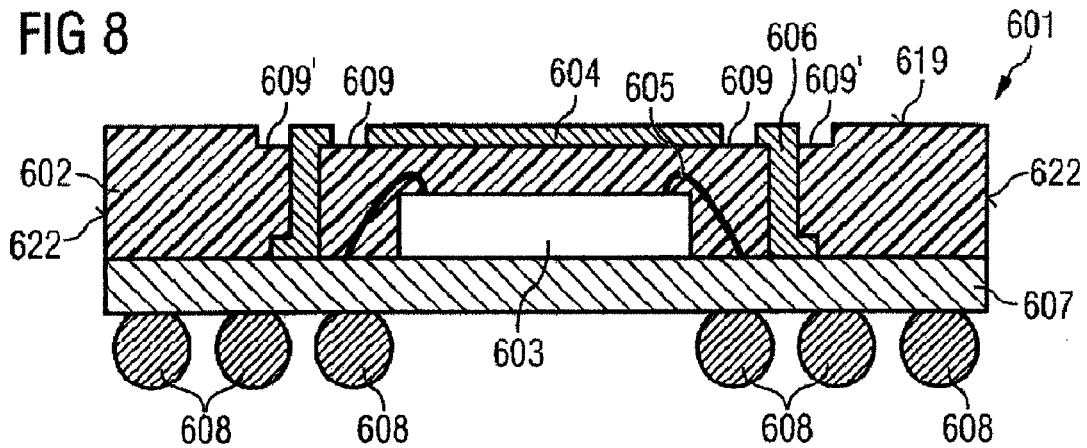
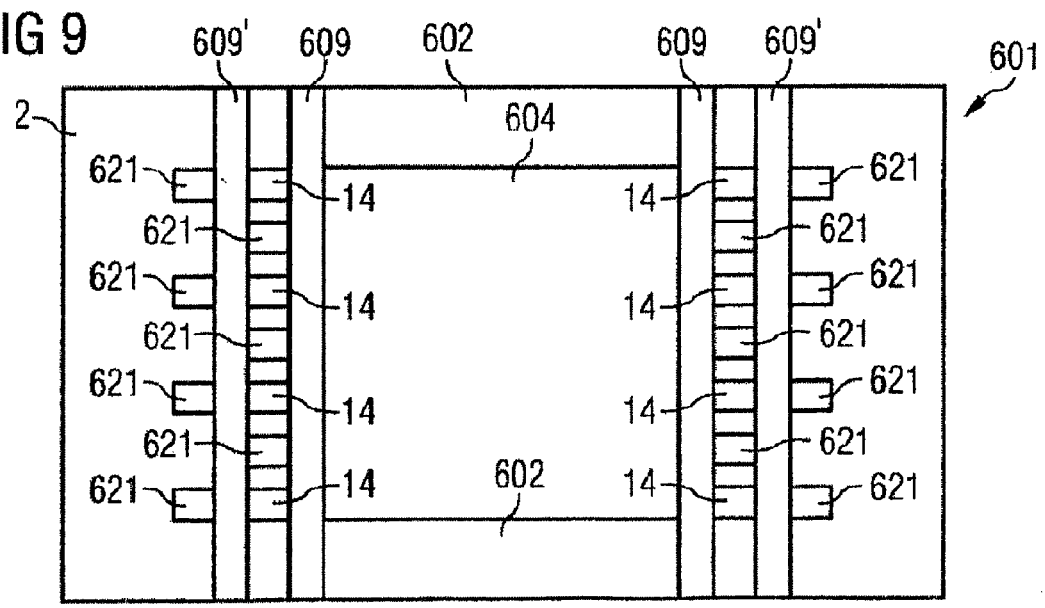

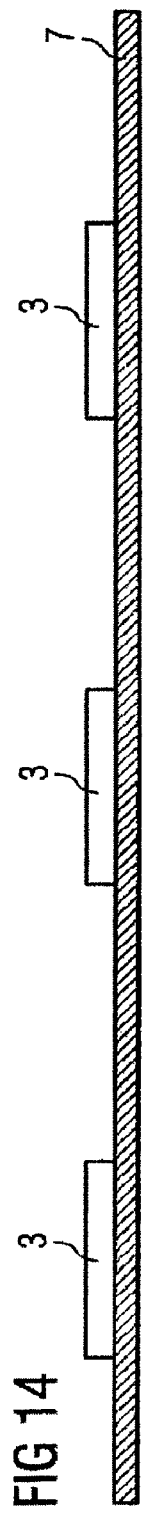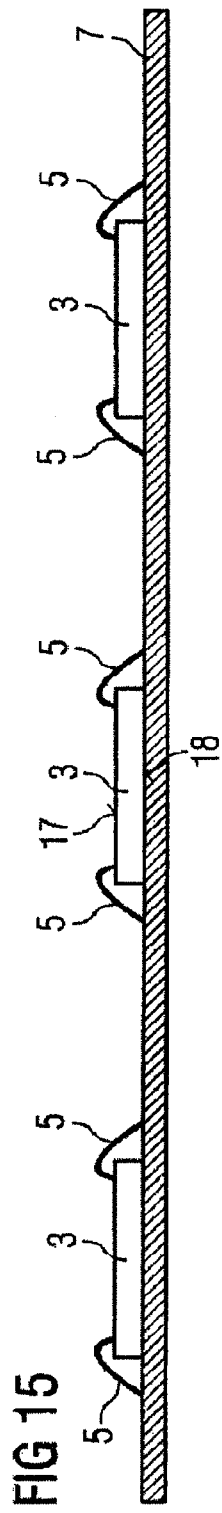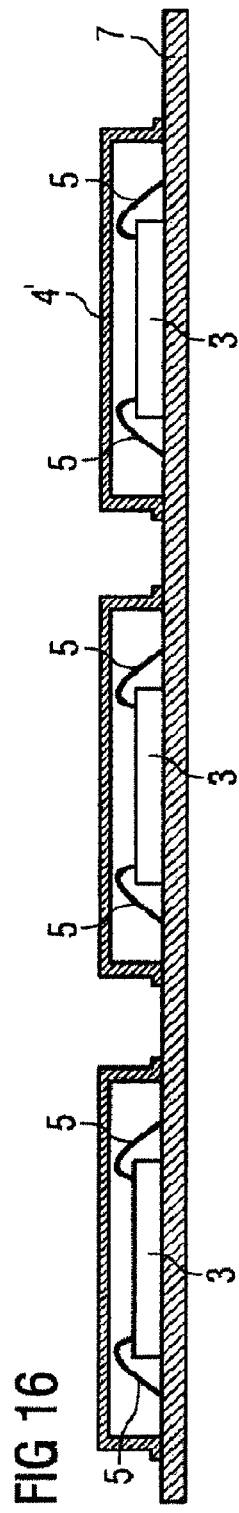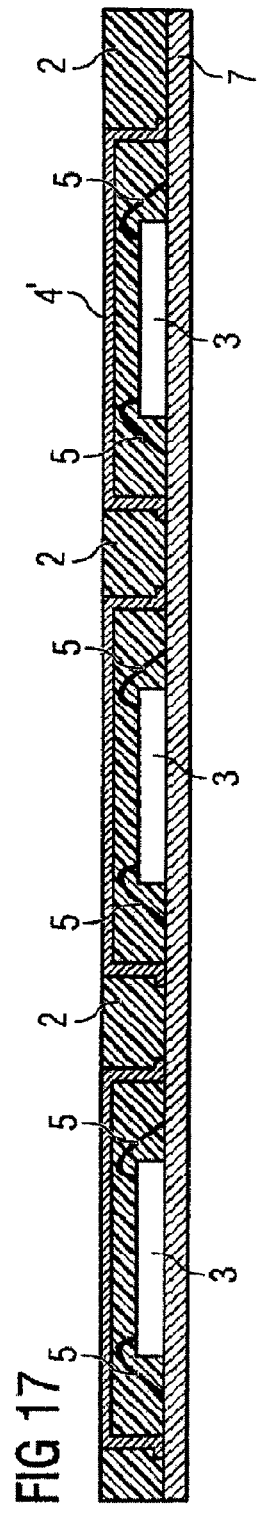

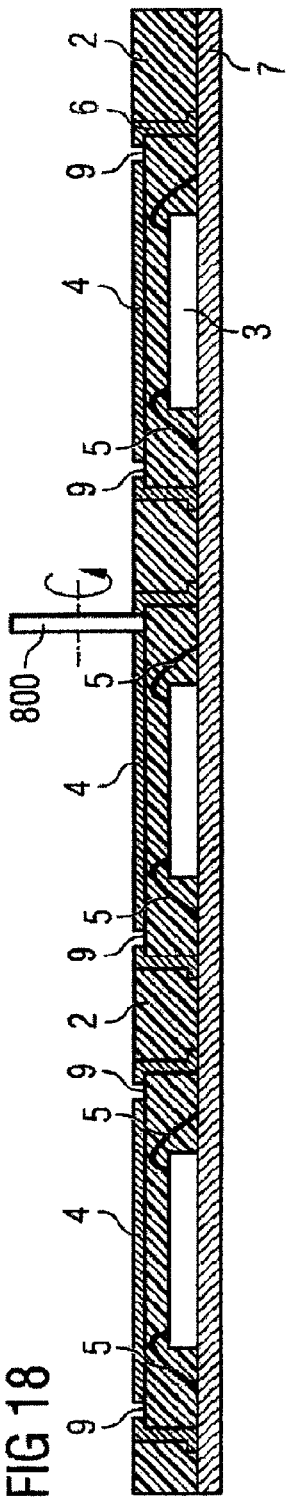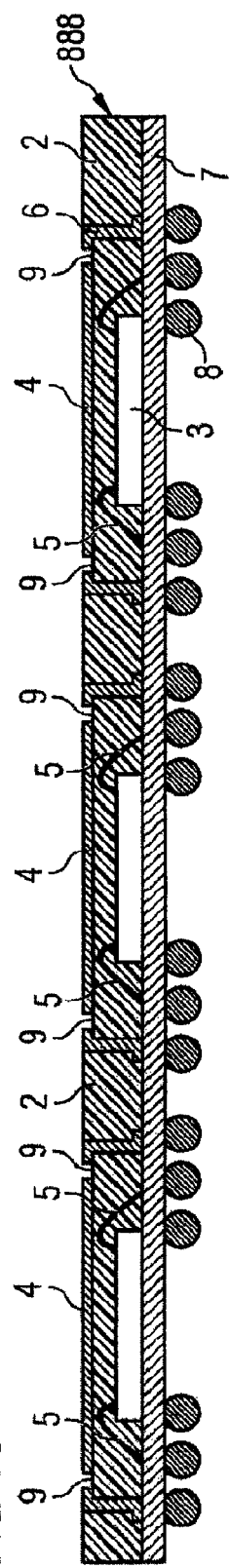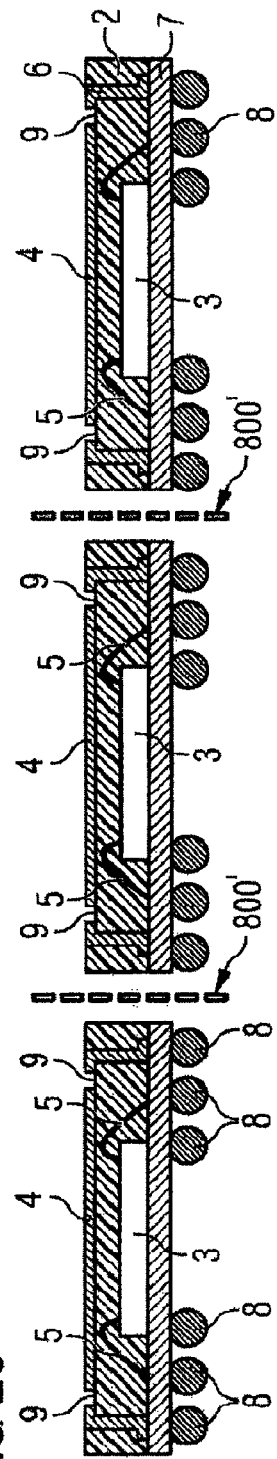

SEMICONDUCTOR DEVICE PACKAGE AND METHODS FOR PRODUCING SAME

RELATED MATTERS

This application claims priority under 35 USC §119 to German Application Serial Number DE 10 2006 000 724.7, filed Jan. 3, 2006, which is incorporated herein by reference in its entirety.

TECHNICAL FIELD

This relates to semiconductor device packages generally and more specifically to the manufacture of semiconductor device packages.

BACKGROUND

As semiconductor circuit chips experience a continuous increase in integration density and functionality, effective heat dissipation poses a challenge which is of greater and greater importance to the semiconductor industry. For dissipation of heat, various packaging concepts are being developed.

BRIEF DESCRIPTION OF THE DRAWINGS

Some embodiments of the invention are described below with reference to the drawings.

FIG. 7 shows a schematic cross section through a further semiconductor package according to some embodiments of the invention;

FIG. 8 shows a schematic cross section through a further semiconductor package according to the invention;

FIG. 9 shows a schematic plan view of the semiconductor package in accordance with FIG. 8;

FIGS. 14-20 show individual partial process steps for producing a semiconductor package according to some embodiments of the invention.

DETAILED DESCRIPTION

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Figure 1:
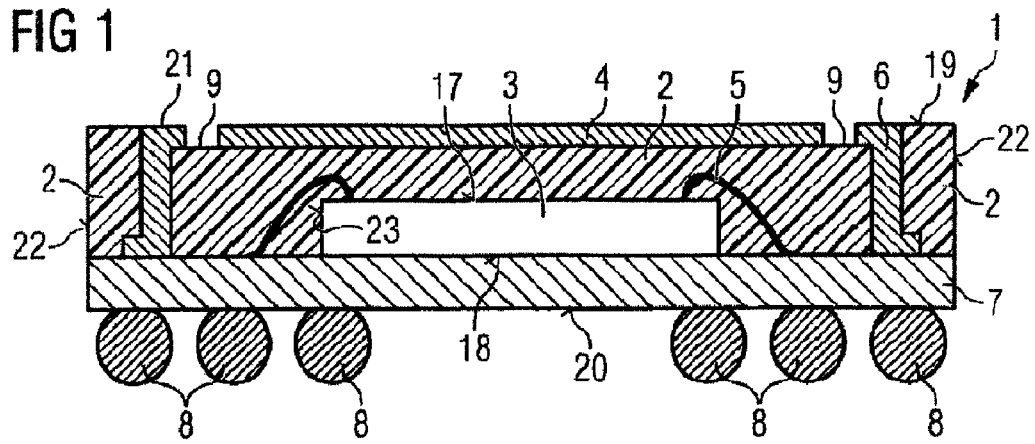
FIG. 1 is a schematic cross-section of a semiconductor package according to some embodiments of the invention.

FIG. 1 is a schematic cross-section of some embodiments of a semiconductor package 1. That package has a filler area 2 having an upper surface area 19, a lower surface area 20 and four lateral side wall areas 22, only two of which are visible here. The semiconductor package 1 is formed on a substrate 7, a semiconductor chip 3 supported above the substrate, and has a heat sink plate 4. It also has through contacts 6 extending upwardly from the substrate nearly to an upper surface of the filler layer. In some embodiments, semiconductor package 1 has electrically conductive solder balls 8 situated on the lower surface area 20 of semiconductor package 1.

In some embodiments, substrate 7 has an insulating layer with substrate contacts formed on one or more layers thereof and contact pad areas provided on a surface area of at least one side of substrate 7. In the embodiments of FIG. 1, the lower area of the substrate 7 corresponds to the lower area 20 of the semiconductor package 1. The contacts and the contact pad areas of substrate 7 are not shown here. This arrangement makes it possible, inter alia, to enlarge the spacing between the connection contacts on the lower side of the substrate 7, in comparison with the contact spacing on the active side of the semiconductor chip 3, which results in easier contact-connection of the semiconductor package externally. Moreover, the use of the substrate with its contact layers permits flexible configuration of the connection contacts on the lower area of the substrate.

In some embodiments, the heat sink plate 4 and the through contacts 6 are produced from copper. In some other embodiments, the moulding leadframes may be formed from any material having good electrical and thermal conductivity, such as copper, aluminium or the alloys thereof.

The balls 8 arranged at the contact areas on the underside 20 of the substrate 7 are electrically connected to the contact areas on the upper side of the substrate 7 via substrate contacts situated in the substrate 7.

In some embodiments, the semiconductor circuit chip 3 is produced from a semiconductor material such as Si or GaAs and has a chip front side 17 with electrical circuits (not shown here) and a chip rear side 18.

In some embodiments, the semiconductor chip 3 is a so-called wire bonding chip. In such embodiments, the electrical contact areas on the chip front side 17 are electrically connected to the contact areas on that side of the substrate, which faces the semiconductor chip 3, via bonding wires 5. The electrical contact areas, are not shown here. The spacing between bonding wires 5, the through contacts 6 and the heat sink 4 are chosen in such a way that the bonding connection between the semiconductor chip 3 and the substrate 7 is not impaired and efficient dissipation of heat by the heat sink 4 is simultaneously made possible.

In some embodiments, a flip-chip may also be provided as the semiconductor chip 3 in the semiconductor package 1. In this case, the semiconductor chip 3 is inverted from the orientation of FIG. 1 and is electrically connected to corresponding contact areas on the substrate 7 via the contact areas on the chip front side 17. In some such embodiments, a smaller overall thickness of the semiconductor package 1 is thereby obtained. By virtue of this type of chip mounting on the substrate 7, the bonding wires 5 are no longer required and the through contacts 6 also become shorter in this case. For that reason, packages constructed according to this embodiment are particularly suitable for radio-frequency applications.

The semiconductor chip 3 lies with the chip rear side 18 on the substrate 7, the contact areas on the chip front side 17 being electrically connected via bonding wires 5 to the contact areas on that side of the substrate 7 which faces the semiconductor chip 3.

The semiconductor package 1 furthermore has a filler layer 2, which encapsulates the chip front side 17 and chip lateral area 23 and also is boded to that side of the heat sink plate 4 which faces semiconductor chip 3 and to the substrate 7. In some embodiments, heat sink plate 4 may be at least partially embedded in the top surface of filler layer 2. The space between the substrate 7 and the heat sink 4 is filled by the filler layer 2 in such a way that the bonding wires 5 are encapsulated in the filler layer 2. The through contacts 6 situated between the substrate 7 and the upper area 19 are also surrounded laterally and encapsulated by the filler layer 2.

In some embodiments, the filler layer 2 and the substrate 7 terminate flush with the lateral area 22 of the semiconductor package 1, with the result that lateral area 22 is formed in sections by the substrate 7 and by the filler layer 2.

The semiconductor package 1 furthermore has at least one trench 9 cut into the upper area 19 of filler layer 2 which physically separates the heat sink 4 from the through contacts 6 and which, in some embodiments, extend transversely across the substantially entire upper area 19 of semiconductor package 1, with the result that the filler layer 2 is uncovered in the trenches 9. Through contacts 6 intersect one wall of trench 9 and heat sink 4 intersects the other wall of the trench.

In some embodiments of the invention, the trenches 9 separating the heat sink plate 4 and through contacts 6 are produced by cutting actions such as sawing or milling, which may lead to sawing, milling or etching through fingers b in the filler layer 2. In some other embodiments of the invention, laser ablation is used for cutting into the filler layer 2 and separating through leads 6 from heat sink plate 4, to produce the semiconductor packages.

In packages produced using embodiments of the process described above, the trenches 9 may exhibit traces of laser ablation. As explained below, both sawing, milling, etching or laser ablation may advantageously be used for producing trenches according to some embodiments of the invention and separating the heat sink plate 4 from through contacts 6 by severing fingers 4b.

Figure 2:
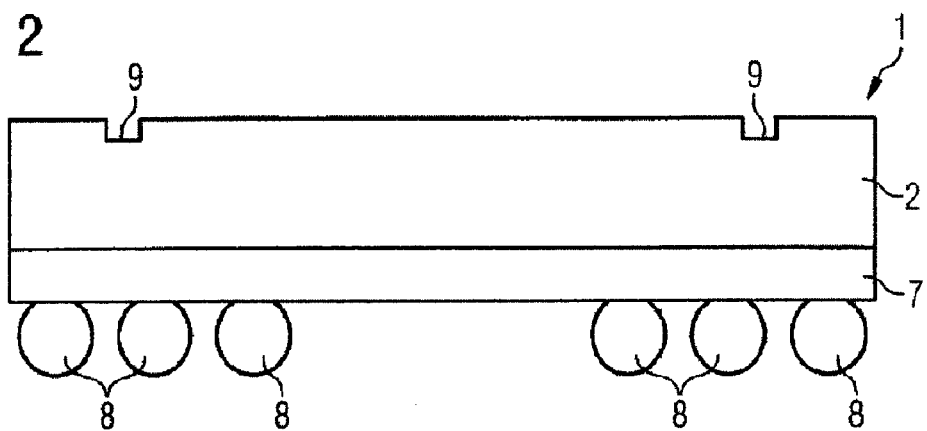
FIG. 2 is a schematic side view of the semiconductor package in accordance with FIG. 1.

FIG. 2 is a schematic side view of the semiconductor package 1 from FIG. 1. The contours of the semiconductor package 1 are readily discernible in this view, and the continuous trenches 9 in the upper area 19 of the semiconductor package 1 can be seen particularly clearly. In addition, FIG. 2 illustrates that the lateral dimensions of the semiconductor package 1 are determined by the substrate 7 and by the filler layer 2.

Figure 3:
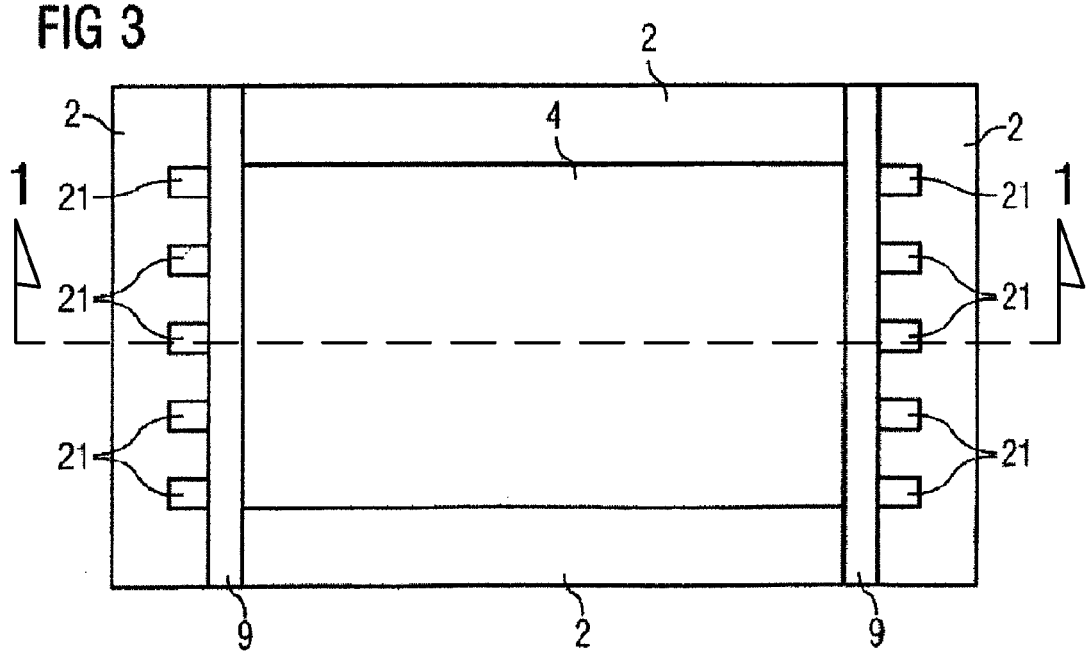
FIG. 3 is a schematic plan view of the semiconductor package in accordance with FIG. 1.

FIG. 3 is a schematic plan view of the semiconductor package 1 shown in FIGS. 1 and 2. Here the upper, exposed areas of through contacts 6 can be seen as contact pads 21 which are positioned along the trenches 9 at the outer edge thereof and are separated from one another by regions of the filler layer 2. A substantial part of the upper area 19 of the semiconductor package 1 is occupied by the heat sink 4, which lies centrally between the two trenches 9 and which terminates flush with the inner edges of the trenches 9. The remainder of the visible surface—that is to say outside the contact pads 21 and the heat sink 4—is formed by the filler layer 2.

Figure 4:
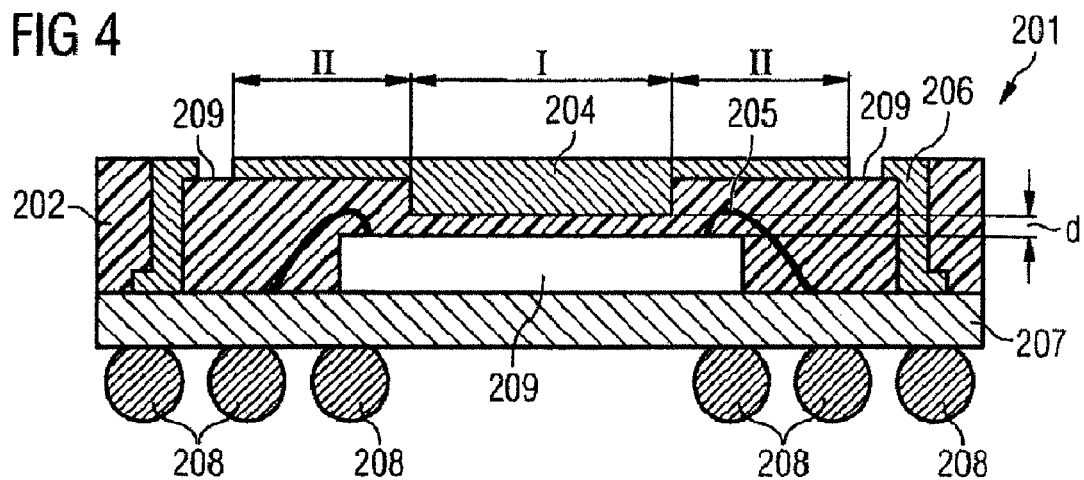
FIG. 4 shows a schematic cross section through a further semiconductor package according to some embodiments of the invention.

FIG. 4 is a schematic cross-section showing a further semiconductor package 201 according to some embodiments of the invention. These embodiments correspond somewhat to the semiconductor package of FIG. 1. Similarly acting parts therefore have the same reference numerals, but increased by 200. One difference between the semiconductor package 201 shown here and the semiconductor package 1 of FIG. 1 consists in the configuration of the heat sink 204, which, in contrast to the heat sink 4 of FIG. 1, has two regions I, II having different thicknesses. An inner region I, having a larger thickness than the outer region II, is situated above the semiconductor chip 203 and partly projects into the space between the bonding wires 205. In some embodiments, the distance, d, between the semiconductor chip 203 and the heat sink 204 is particularly small in this region. The inner or middle region I, having a relatively large thickness may, for example, improve the function of the heat sink 4 as a heat distributor because the distance, d, between the semiconductor chip 3 and the heat sink 4 can be kept particularly small in this region.

In the case of a wire bonding chip 3, by way of example, the heat sink 4 may partly project into the space between the bonding wires, as a result of which the distance between the semiconductor chip and the heat sink is particularly small. In some embodiments, the outer region II of the heat sink 204 corresponds approximately to the heat sink plate 4 from FIG. 1 in terms of thickness.

Figure 5:
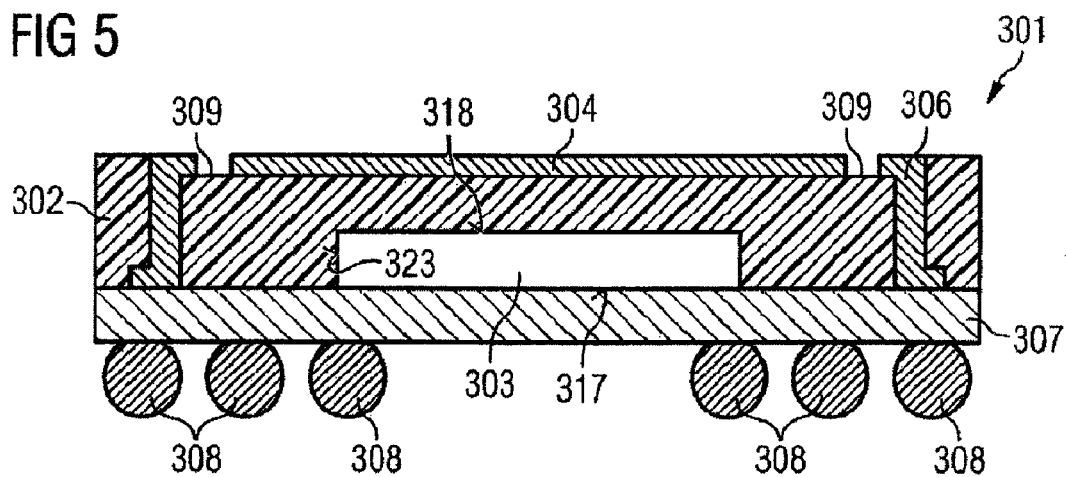
FIG. 5 shows a schematic cross section through a further semiconductor package according to some embodiments of the invention.

FIG. 5 is a schematic cross-section through a further semiconductor package 301 according to some embodiments of the invention. This embodiment also generally corresponds to the semiconductor package from FIG. 1. Similarly acting parts therefore have the same reference numerals, but increased by 300. The semiconductor chip 303 is a flip-chip with the chip front side 317 supported above the substrate 307. The semiconductor chip 303 is electrically coupled, via the contact areas (not shown here) on the chip front side 317, to corresponding contact areas (likewise not illustrated here) on the substrate 307. In some embodiments, the chip rear side 318, remote from the substrate 307, and also the lateral areas 323 of the semiconductor chip 303 are covered by the filler layer 302.

Figure 6:
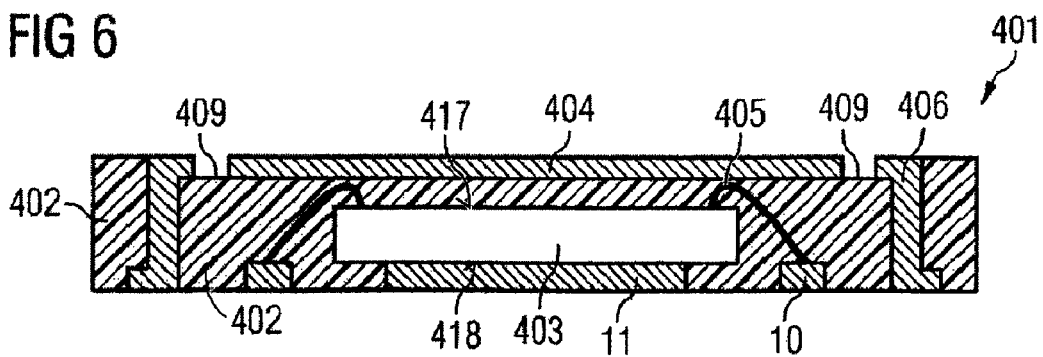
FIG. 6 shows a schematic cross section through a further semiconductor package according to some embodiments of the invention.

FIG. 6 is a schematic cross-section of a further semiconductor package 401 according to some embodiments of the invention. This embodiment also substantially corresponds to the semiconductor package from FIG. 1. Similarly acting parts therefore have the same reference numerals, but increased by 400.

In this embodiment, the semiconductor package 401 has a chip island 11 and also contact bumps 10. The semiconductor chip 403 bears with the chip rear side 418 on the chip island 11. The bonding wires 405 connect the contact areas (not shown here) on the chip front side 417 to the contact bumps 10. The at least one chip island 11 is at least partly embedded in the filler layer 402. It may terminate flush with the lower area of the electronic package 1 and serve as a direct external contact.

In some embodiments, the uncovered areas of contact bumps 10, of the chip island 11 and also the lower contact pad areas of the through contacts 406 terminate flush with the filler layer 402, so that these areas are externally accessible for contact-connection and also for further processing.

In some embodiments, further metal islands or contact bumps 10 are provided which may serve as connections for the bonding wires 5. Both chip islands 11 and contact bumps 10 may advantageously be used as external contacts. A further advantage of this construction is that a particularly thin semiconductor package 1 is obtained, which may be particularly important when the semiconductor package is used in confined space conditions. Such a package can, moreover, be produced easily by providing a lead frame or a substrate having metallic elevations as a support and then finally removing the support once the semiconductor package has been completed. In this case, at locations of metallic elevations there remain local metallic regions in the form of chip islands and contact bumps which are at least partly embedded in the filler layer 402.

FIG. 7 is a schematic cross-section of a further embodiment of a semiconductor package 501 according to the invention. This embodiment also substantially corresponds to the semiconductor package 1 from FIG. 1. Similarly acting parts therefore have the same reference numerals, but increased by 500.

In contrast to some of the embodiments above, the semiconductor package 501 has a circuit board or wiring connection region 13 which carries conductive paths, not shown, which are connected to the heat sink 504 and also to the upper contact pad areas of the through contacts 506. In some embodiments, region 13 has conductive paths and terminals (not illustrated here) and also electrical connections (likewise not illustrated here) at its upper and its lower areas. In some embodiments, region 13 is a printed circuit board. In some embodiments some of the connections on the upper side of the wiring region 13 are electrically connected to the through contacts 506 via the conductive paths and through the connections on the lower side of region 13.

In some embodiments, the trenches 509 between the through contacts 506 and the heat sink 504 are provided with an insulation filling 12. These embodiments permit the upper area of the semiconductor device to be smoothed or planarized, which may be very advantageous in many applications. In particular, this improves the further processability of or capability of equipping the upper area of the semiconductor device. By way of example, further planar structures such as wiring connection region 13 may be produced on the surface of the planar upper area 19.

FIG. 8 is a schematic cross-section of a further semiconductor package 601 according to some embodiments of the invention. These embodiments also substantially correspond to the semiconductor package 1 from FIG. 1. Similarly acting parts therefore have the same reference numerals, but increased by 600.

These embodiments of the invention have, on upper area 619, two further trenches 609' which adjoin the through contacts 606 and which are arranged on the sides of the through contacts 606 which face the lateral areas 622.

FIG. 9 is a schematic plan view of the semiconductor package 601 in accordance with FIG. 8. The additional continuous trenches 609 can be seen particularly clearly in this view. Two continuous trenches 609, 609' and also the open areas of the through contacts 606 can be seen in each case on the right and on the left of the heat sink 604. In addition, the semiconductor package 601 has dummy contacts 14 between the trenches 609 on both sides of the heat sink 604. The remainder of the visible surface—that is to say outside the uncovered areas of the through contacts 606 and the heat sink 604—is formed by the filler layer 602.

Figure 10:
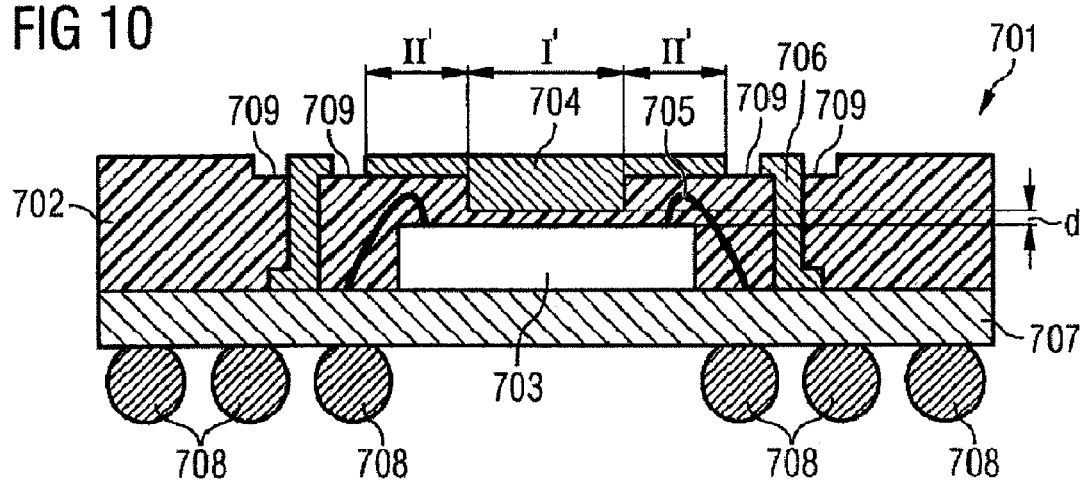
FIG. 10 shows a schematic cross section through a further semiconductor package according to some embodiments of the invention.

FIG. 10 shows a schematic cross section through a further semiconductor package 701 according to the invention. This embodiment differs from embodiments of the semiconductor package in accordance with FIGS. 8 and 9 by the provision of a heat sink 704 having two regions I' and II' having different thicknesses arranged in a manner similar to heat sink 204 of FIG. 4. In this case, the inner region—i.e., above the semiconductor chip 703—has a greater thickness and partly projects into the space between the bonding wires 705, with the result that the distance, d, between the semiconductor chip 703 and the heat sink 704 is particularly small in this region.

Figure 11:
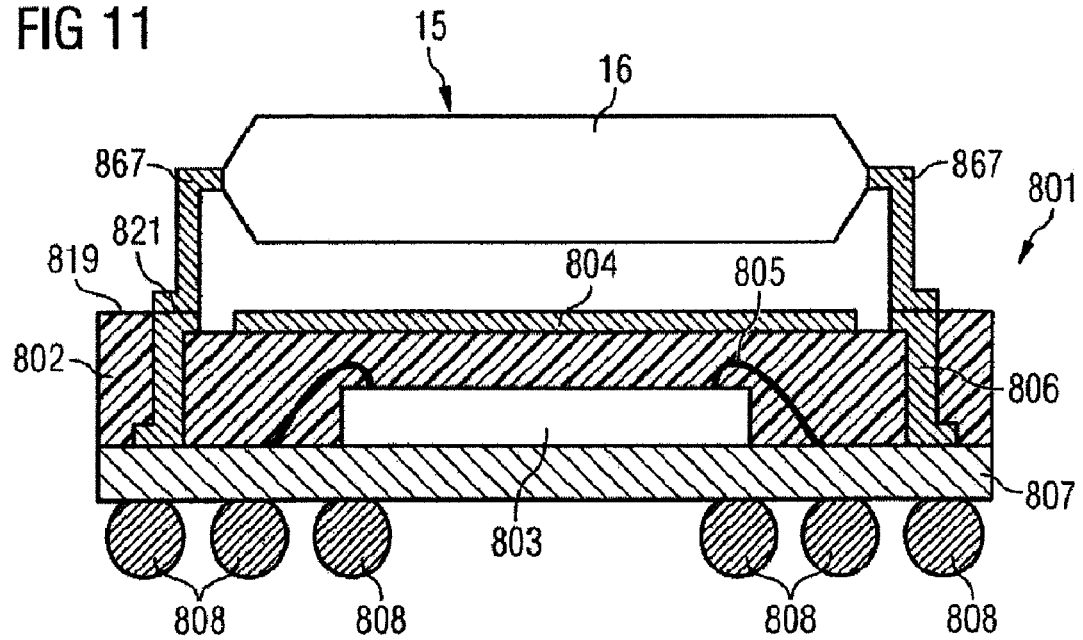
FIG. 11 shows a stack with a semiconductor package according to some embodiments of the invention.

FIG. 11 is a schematic cross-section through a stack of semiconductor packages according to some embodiments of the invention. Stacking involves a plurality of packages or components being stacked one on top of another.

The stack has a semiconductor package or device 801 in accordance with the embodiments of FIG. 1, onto which package is placed a further electronic device 15, a housing 16 and contact-connecting legs 867. In some embodiments, the contact-connecting legs 867 are electrically connected to the through contacts 806 by means of a soldering layer which is not depicted here.

Figure 12:
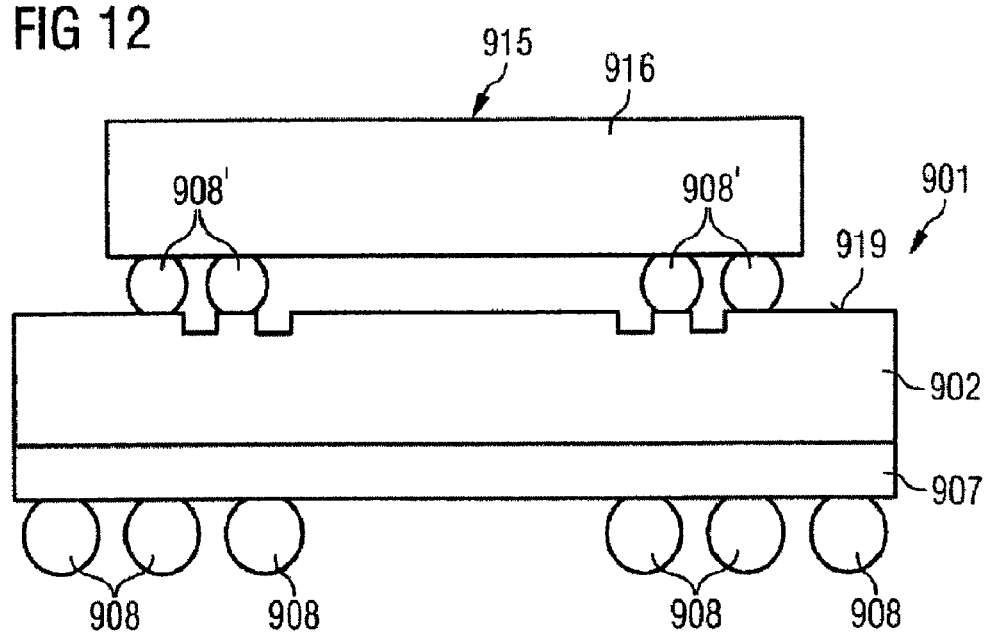
FIG. 12 shows a further stack with a semiconductor package according to some embodiments of the invention.

FIG. 12 is a schematic cross-section through a further stack comprising two electronic semiconductor devices 901 and 916. Situated on the upper area 919 of the semiconductor device 901 according to embodiments of the invention in accordance with FIG. 8, is a further external device 915 having a housing 916 embodied in the form of a ball grid assembly (BGA). In this embodiment, the contact-connecting balls 908' of the external device 915 are in external contact with the contact pads of the through contacts (not illustrated here) of the semiconductor device 901.

The packages to be provided may have very different constitutions depending on their task. Their housings may also have different shapes and different contact-connecting elements. Thus, on the contact islands of the semiconductor package 1, both housings having balls 908' and housings having contact legs 867 may be placed on the contact islands of the semiconductor package 1.

Figure 13:
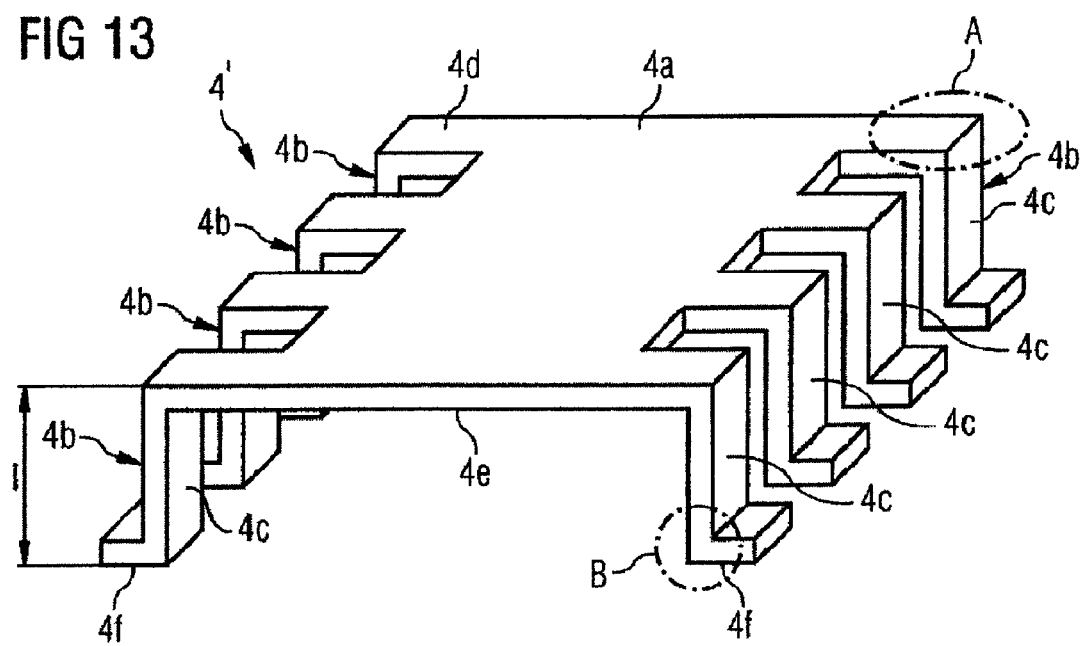
FIG. 13 schematically shows a perspective illustration of a moulding lead frame according to some embodiments of the invention.

FIG. 13 is a perspective illustration of a moulding lead frame according to some embodiments of the invention. In some embodiments, the moulding lead frame for producing the semiconductor package according to the invention is structured into a generally planar body region, a plurality of lateral fingers each having a distal end and a connecting region between the distal end and the generally planar body region. The distal end of the lateral fingers is displaced from the plane of the planar body region. The precise form and dimensioning of the moulding lead frame, in particular the distance that the distal ends of the lateral fingers are displaced from the plane of the planar body region, and also the number and configuration of the fingers, may be chosen in each case in a package-specific manner in order to achieve an optimum effect.

Forming the lead frame integrally from a material having good thermal conductivity is advantageous primarily in the body region of the moulding leadframes because these regions serve as heat sinks later. A good electrical conductivity is advantageous primarily for the fingers of the moulding lead frame since through contacts are formed from these regions later, once the fingers are separated from the heat sink body region.

The moulding leadframe may be embodied in such a way that the distal ends of the fingers and the generally planar body region are essentially parallel. A moulding leadframe configured in this way can be placed onto the substrate readily during the production of the package according to embodiments of the invention. It is also advantageous, in some embodiments, for the regions of the moulding leadframe that are to be separated to be kept thin in order to facilitate the production process.

The moulding lead frame 4', which, in some embodiments, is formed integrally from copper, has a body 4a—having a top side 4d and an underside 4e—and a plurality of fingers 4b formed in the lateral region of the moulding lead frame 4'. In this embodiment, all the fingers 4b are of identical construction and have in each case a bending region A, in each case a bending region B, in each case a longitudinal region 4c and in each case a bearing area 4f, the longitudinal region 4c extending between the bearing area 4f and the bending region A. In the bending regions A and in the bearing regions 4f, the fingers 4b are bent by approximately 90 degrees, with the result that the bearing regions 4f and the body 4a are approximately parallel. The overall length of the through contacts formed from the fingers in the production process is thereby kept as short as possible, which is particularly advantageous for radio frequency applications.

FIGS. 14-20 show individual partial process steps for producing the package according to some embodiments of the invention in accordance with FIG. 1.

FIG. 14 shows a first process, in which the substrate 7 is provided and equipped with the semiconductor chips 3. In some embodiments a first act involves providing a substrate blank. In some embodiments, the substrate blank is a substrate blank made of an insulating material with contact pads and contact paths on both surfaces. In some embodiments, such substrates are suitable particularly for specific housing classes, such as for so-called BGA housings, by way of example.

On the other hand, in some embodiments, it is also possible to use metallic substrates. Such substrates have the advantage that they can also serve as sacrificial substrates which can be removed easily in a later step, e.g. by etching.

In FIG. 14, the semiconductor chips 3 are placed onto the upper area of the substrate 7 by the chip rear side and fixed by means of an adhesive layer (not illustrated here). The semiconductor chips may be fixed by means of an adhesive layer, adhesive film or by soldering on the locations provided therefore on the substrate.

The simultaneous application of a plurality of chips to the substrate blank enables simultaneous production of semiconductor housings in a parallel production method, whereby the production outlay can be minimized.

Afterwards, the contact areas (not shown here) on the chip front side 17 are connected to the contact areas (likewise not illustrated) on the upper side of the substrate 7 that faces the semiconductor chips 3, to be precise by means of the bonding wires 5, as is shown in FIG. 15.

In a next process, the substrate 7 is equipped with the moulding leadframes 4', as is shown in FIG. 16. The operation comprises attaching extended fingers 4b of lead frame 4' to substrate 7, the fingers 4b extending upwardly to support the body 4a of the lead frame above an upper surface of semiconductor chip 3 which is supported by substrate 7. The lead frame 4b is attached in such a way that semiconductor chip 3 is situated below each moulding lead frame 4', and that the moulding leadframes are placed onto the substrate blank by their bearing areas 4f of fingers 4b.

The overall construction is then encapsulated with a filler layer 2 that terminates flush with the upper area of the moulding leadframes 16, as is shown in FIG. 17. Prior to encapsulating the semiconductor chip and the extended fingers 4b of lead frame 4b to form filler layer 2, it is possible to provide bonding wires 5 for electrical connection between the contact areas situated on the semiconductor chips 3 and the contact areas on the substrate blank 7. This production method makes it possible to use so-called wire bonding chips 3 as semiconductor chips. They are semiconductor chips whose contact areas or contact pads are contact-connected with metal wires, the so-called bonding wires 3.

A so-called moulding process is well suited to the application of the filler layer 2. In this case, a moulding tool or a moulding cap is placed onto the substrate blank equipped with the chips and with the heat crowns in such a way as to form a volume to be moulded between the substrate blank and the moulding cap. In some embodiments, the connecting elements may be embodied as compliant or resilient elements, whereby the reliability of the moulding process can be considerably improved. This is because the possibility of the moulding leadframes being damaged by the moulding cap is thereby reduced.

In some embodiments, a so-called film moulding process appears to be particularly advantageous. This method avoids direct mechanical contact between the components to be molded—such as semiconductor chips or moulding leadframes—and the moulding tool by the use of a plastic film. Placing the plastic film on the inner area of the moulding tool ensures that the components to be moulded are sealed from above in order that the filler layer 2 does not reach the upper area of moulding leadframes 4'. On the other hand, the plastic film ensures that the moulding tool does not damage the moulding leadframes.

FIG. 18 shows cutting trenches in the filler layer in a subsequent operation to separate the extended fingers 4b from the body 4a of lead frame 4. In this operation, the filler layer 4 that has been produced in the encapsulation operation is incipiently sawn from above in some embodiments, by means of a saw blade, in such a way that the moulding leadframes 4' are divided into two functional units-namely into the heat sinks 4 and the fingers 4b which become through contacts 6. In some embodiments cutting trenches in this way provides an advantage since it is possible to use a method of cutting the trenches which is also used during singulation of the packages.

In some embodiments, the cutting of trenches in the filler layer to separate the extended fingers 4b from the body 4a of lead frame 4' may be effected by laser ablation. Laser ablation is a flexible method, particularly with regard to its selective removal of material. In this case, the selectivity of the removal may be both location-dependent and material-dependent. As necessary, the upper area 4d of the moulding lead frame or of the heat sink 4 may additionally be patterned as necessary by the laser. The trenches 9 are thus formed in the process. The through contacts 6 fully extend through the total thickness of the filler layer 2. In these embodiments, both the through contacts 6 and heat sink 4 are provided in a single process operation.

FIG. 19 shows a next process in which that side 20 of the substrate 7 which is remote from the semiconductor chips is provided with the balls 8. Contact-connecting elements such as contact bumps or balls are applied on the lower side of the substrate blank prior to the singulation of the electronic semiconductor packages. In this case, the contact-connecting elements may be configured flexibly in application-specific fashion.

FIG. 20 shows how the packages 1 according to the invention are separated from the panel from FIG. 19 by sawing in a final singulation process. The broken lines in each case indicate the positions of the saw blade 800'.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. An apparatus, comprising:
a semiconductor chip supported on a chip island;
a filler layer encapsulating the semiconductor chip;
a heat sink;
through contacts extending, through the filler layer to an upper surface of the filler layer, the through contacts separated from the heat sink by a first trench cut into the upper surface of the filler layer, the through contacts being separated by a second trench from a vertical wall of the filler layer adjacent to the upper surface of the filler layer, the through contacts lying between the first trench and the second trench, the through contacts having exposed areas positioned along an outer edge of the first and second trenches, the exposed areas separated from each other by regions of the filler layer, wherein the heat sink terminates flush with an inner edge of the first trench and the first trench contains an electrically insulating material; and
contact bumps, partially embedded within the filler layer and connected to an upper surface of the semiconductor chip by bonding wires, wherein the chip island, the through contacts, and the contact bumps terminate flush with a lower surface of the filler layer.

2. The apparatus of claim 1, wherein the heat sink has regions having different thickness.

3. The apparatus of claim 2, wherein the heat sink is positioned above the semiconductor chip.

4. The apparatus of claim 3, wherein the heat sink has a thicker region adjacent an upper surface of the semiconductor chip and a thinner region positioned above the bonding wires to provide clearance for the bonding wires.

5. The apparatus of claim 1, wherein the filler layer covers a top and sides of the semiconductor chip.

6. The apparatus of claim 1, wherein the heat sink has a thicker region adjacent to an upper surface of the semiconductor chip to reduce the distance between the semiconductor chip and the heat sink.

7. The apparatus of claim 1, wherein the exposed areas of the through contacts form contact pads.

8. The apparatus of claim 1, wherein the at least one trench comprises two trenches, wherein the heats sink lies substantially centrally between the two trenches and terminates flush with the inner edges of the two trenches.

9. An apparatus, comprising:
a semiconductor chip supported by a chip island;
a filler layer encapsulating a top and sides of the semiconductor chip;
a heat sink thermally coupled to and separated from the semiconductor chip by a portion of the filler layer, wherein a portion of the heat sink is thicker proximate to the semiconductor chip;
through contacts extending, through the filler layer to an upper surface of the filler layer, the through contacts separated from the heat sink by a first trench cut into the upper surface of the filler layer, the through contacts being separated by a second trench from a vertical wall of the filler layer adjacent to the upper surface of the filler layer, the through contacts lying between the first trench and the second trench, the through contacts having exposed areas positioned along an outer edge of the first and second trenches, the exposed areas separated from each other by regions of the filler layer, wherein the heat sink terminates flush with an inner edge of the first trench and the first trench contains an electrically insulating material;
contact bumps, partially embedded within the filler layer and connected to an upper surface of the semiconductor chip by bonding wires; and
bonding wires electrically connected between the top of the semiconductor chip and the contact bumps, wherein the chip island, the through contacts, and the contact bumps terminate flush with a lower surface of the filler layer.

10. Apparatus, comprising:
a semiconductor chip supported on a chip island;
a filler layer encapsulating the semiconductor chip;
a heat sink;
through contacts extending upwardly nearly to an upper surface of the filler layer, the through contacts being separated from the heat sink by a first trench cut into the upper surface of the filler layer, the through contacts being separated by a second trench from a vertical wall of the filler layer adjacent to the upper surface of the filler layer, and the through contacts lying between the first trench and the second trench; and
contact bumps, partially embedded within the filler layer and connected to an upper surface of the semiconductor chip by bonding wires, wherein the chip island, the through contacts, and the contact bumps terminate flush with a lower surface of the filler layer.

* * * * *

UNITED STATES PATENT AND TRADEMARK OFFICE
CERTIFICATE OF CORRECTION

PATENT NO. : 8,994,161 B2  
APPLICATION NO. : 11/619106  
DATED : March 31, 2015  
INVENTOR(S) : Ahr et al.

Page 1 of 1

It is certified that error appears in the above-identified patent and that said Letters Patent is hereby corrected as shown below:

On the Title page, item (30), in "Foreign Application Priority Data", in column 1, line 1, delete "10 2006 000 724" and insert --10 2006 000 724.7--, therefor On the Title page, item (57), in "Abstract", in column 1, line 10, delete "lead frame" and insert --leadframe--, therefor Signed and Sealed this  
Fifteenth Day of September, 2015

Michelle K. Lee  
*Director of the United States Patent and Trademark Office*